(12) United States Patent
Yang et al.

(10) Patent No.: US 11,908,973 B2
(45) Date of Patent: Feb. 20, 2024

(54) LIGHT-EMITTING DEVICE

(71) Applicant: XIAMEN SAN'AN OPTOELECTRONICS CO., LTD., Fujian (CN)

(72) Inventors: Renlong Yang, Fujian (CN); Ping Zhang, Fujian (CN)

(73) Assignee: XIAMEN SAN'AN OPTOELECTRONICS CO., LTD., Fujian (CN)

(*) Notice: Subject to any disclaimer, the term of this patent is extended or adjusted under 35 U.S.C. 154(b) by 323 days.

(21) Appl. No.: 17/448,550

(22) Filed: Sep. 23, 2021

(65) Prior Publication Data

US 2022/0102581 A1 Mar. 31, 2022

(30) Foreign Application Priority Data

Sep. 25, 2020 (CN) .......................... 202011021816.4

(51) Int. Cl.
  *H01L 33/14* (2010.01)
  *H01L 33/38* (2010.01)

(52) U.S. Cl.
  CPC .............. *H01L 33/14* (2013.01); *H01L 33/38* (2013.01); *H01L 33/382* (2013.01)

(58) Field of Classification Search
  CPC ..... H01L 33/38; H01L 33/145; H01L 33/382; H01L 33/14; H01L 33/36
  See application file for complete search history.

(56) References Cited

U.S. PATENT DOCUMENTS

| | | | |
|---|---|---|---|
| 9,530,934 B1* | 12/2016 | Chou | H01L 33/38 |
| 9,865,775 B2* | 1/2018 | Suh | H01L 24/05 |
| 10,193,017 B2* | 1/2019 | Kim | H01L 33/145 |
| 10,505,092 B2* | 12/2019 | Chang | H01L 33/20 |
| 10,672,951 B2* | 6/2020 | Suh | H01L 24/48 |
| 10,784,427 B2* | 9/2020 | Chang | H01L 33/20 |
| 10,886,436 B2* | 1/2021 | Na | H01L 33/38 |
| 10,923,642 B2* | 2/2021 | Woo | H01L 33/38 |

* cited by examiner

*Primary Examiner* — Savitri Mulpuri
(74) *Attorney, Agent, or Firm* — Thomas | Horstemeyer, LLP

(57) ABSTRACT

A light-emitting devise includes first and second type semiconductor layers, an active layer interposed therebetween, a current blocking layer disposed on the first type semiconductor layer and including a first strip portion, and a first electrode disposed on the current blocking layer and including a first electrode pad, a first electrode end portion distal from the first electrode pad, and a first electrode extension portion extending between the first electrode pad and the first electrode end portion. The first strip portion of the current blocking layer is located beneath the first electrode extension portion, and has a widened section having a width that gradually increases in a direction away from the first electrode pad.

16 Claims, 8 Drawing Sheets

LIGHT-EMITTING DEVICE

CROSS-REFERENCE TO RELATED APPLICATION

This application claims priority of Chinese Invention Patent Application No. 202011021816.4, filed on Sep. 25, 2020.

FIELD

The disclosure relates to a light-emitting device, and more particularly to a light-emitting device with high reliability.

BACKGROUND

Referring to FIG. 1, a conventional light-emitting device includes a light-emitting epitaxial structure 1 including a first type semiconductor layer, a second type semiconductor layer, an active layer interposed therebetween, and first and second electrodes 4, 5 electrically connected to the first and second type semiconductor layers, respectively. The first type semiconductor layer may be made from a p-type semiconductor and serves to provide holes, and the second type semiconductor layer may be made from an n-type semiconductor and serves to provide electrons. The conventional light-emitting device is driven by an external power source that is electrically connected to the first and second electrodes 4, 5 to emit light.

In the case that the light-emitting epitaxial structure 1 is made of nitride-based semiconductor, the first type semiconductor layer (i.e., the p-type semiconductor) has a lower conductivity than the second type semiconductor layer (i.e., the n-type semiconductor). Hence, current may not uniformly spread in the first type semiconductor layer laterally, which results in current crowding effect in the light-emitting epitaxial structure 1 locally. When the current crowding effect occurs, the conventional light-emitting device easily burnt out due to electrostatic discharge. To obtain uniform spreading of the current, the conventional light emitting device further includes a transparent conductive layer 2 (e.g., indium tin oxide layer, ITO layer) disposed between the light-emitting epitaxial structure 1 and the first electrode 4, and a current blocking layer 3 disposed beneath the first electrode 4. The current blocking layer 3 has a larger area than that of the first electrode 4, and has a shape similar to that of the first electrode 4, so as to facilitate lateral spreading of current and to block the current from vertically flowing from the first electrode 4 toward the light-emitting epitaxial structure 1 directly. In current practice, the first electrode 4 includes a pad 41 and an extension 42 extended from the pad 41. The current, blocking layer 3 includes a strip portion that is located beneath the extension 42 of the first electrode 4 and that expands equidistantly to both sides with respect to the first electrode 4, as shown in FIG. 1. Furthermore, a width difference between the entire strip portion of the current blocking layer 3 and that of the entire extension 42 of the first electrode 4 is fixed.

However, the extension 42 of the first electrode A has an end distal from the pad 41, and static electric charges are liable to concentrate thereon. Furthermore, there is an alignment offset occurring between the extension 42 of the first electrode 4 and the strip portion of the current blocking layer 3 due to process error during photolithography. In the case that the extension 42 of the first electrode A is formed as a polyline or a curve near the end, the alignment offset would become more serious at such turning section, as shown in FIGS. 2 to 4. Accordingly, the end of the first electrode 4 is prone to current crowding, and burnout caused by electrostatic discharge (ESD) are likely to occur near the end of the first electrode 4 when subjected to an electrostatic shock, as shown by area A in FIGS. 2 and 3. That is, the serious alignment offset, would lead to poor BSD resistance, resulting in lower yield of the conventional light-emitting device (i.e., a relatively high percentage of light-emitting devices with burnout) under ESD testing.

SUMMARY

Therefore, an object of the disclosure is to provide a light-emitting device that can alleviate or eliminate at least one of the drawbacks of the prior art.

According to the disclosure, a light-emitting device includes a first type semiconductor layer, a second type semiconductor layer, an active layer disposed therebetween, a current blocking layer that, is disposed on the first type semiconductor layer to expose a portion of the first type semiconductor layer, and a first electrode disposed on the current blocking layer.

The current blocking layer includes a first strip portion.

The first electrode includes a first electrode pad, a first electrode end portion distal from the first electrode pad, and a first electrode extension portion extending between the first, electrode pad and the first electrode end portion.

The first strip portion of the current blocking layer is located beneath the first electrode extension portion, and has a widened section having a width that gradually increases in a direction away from the first electrode pad.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 1:
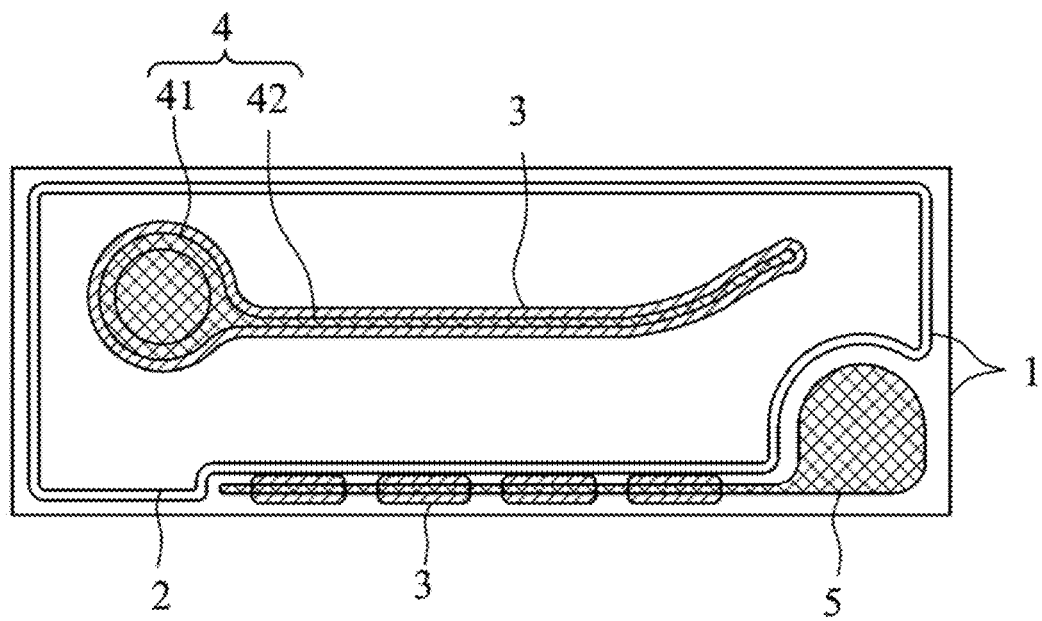
FIG. 1 is a top view illustrating a conventional light-emitting device.
Figure 2:
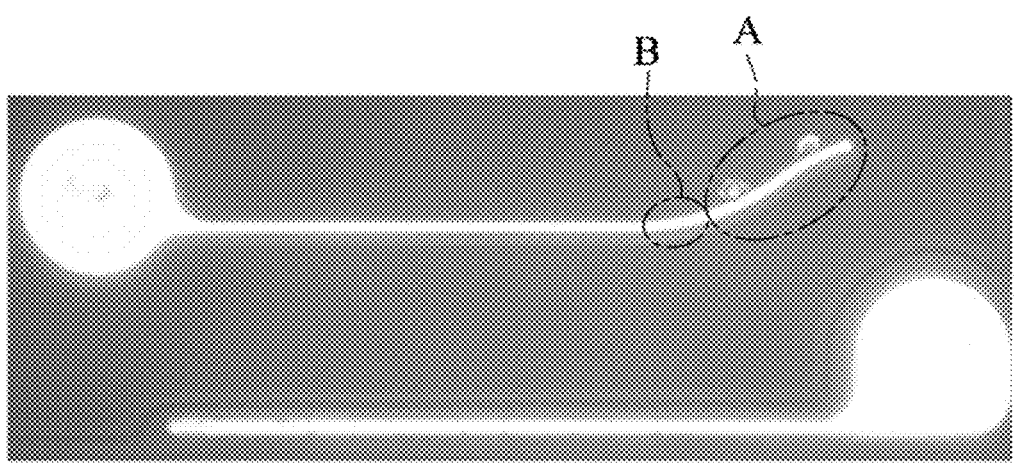
FIG. 2 is an image of the conventional light-emitting device with burnout.
Figure 3:
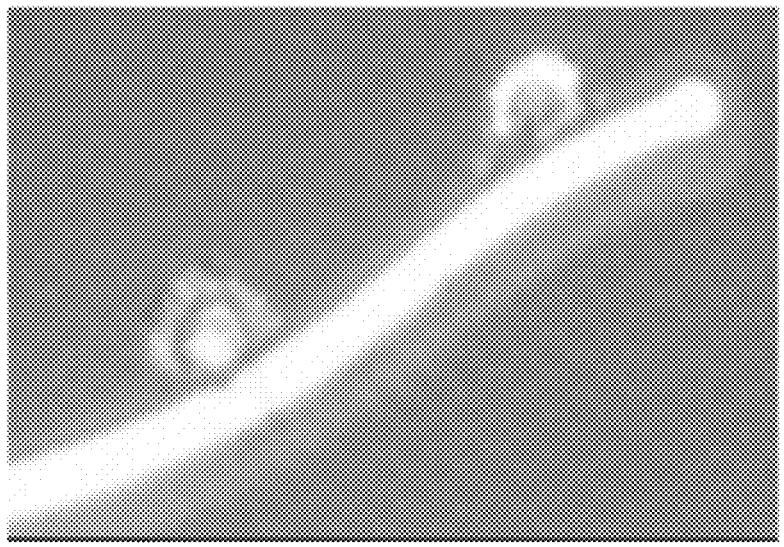
FIG. 3 is a partial enlarged view of area A in FIG. 2.
Figure 4:
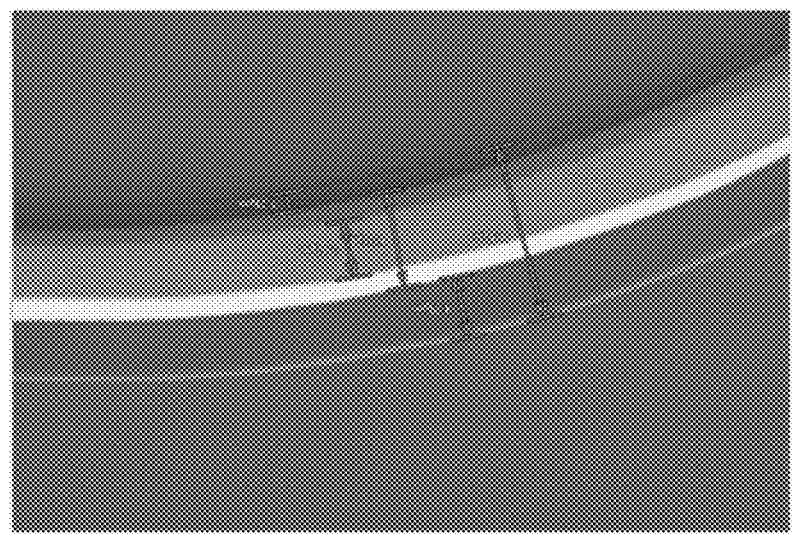
FIG. 4 is a partial enlarged view of a first electrode and a current blocking layer of the conventional light-emitting device before BSD testing in position corresponding to area B in FIG. 2.

Before the disclosure 13 described in greater detail, it should be noted that where considered appropriate, reference numerals or terminal portions of reference numerals have been repeated among the figures to indicate corresponding or analogous elements, which may optionally have similar characteristics.

Embodiment 1

Figure 5:
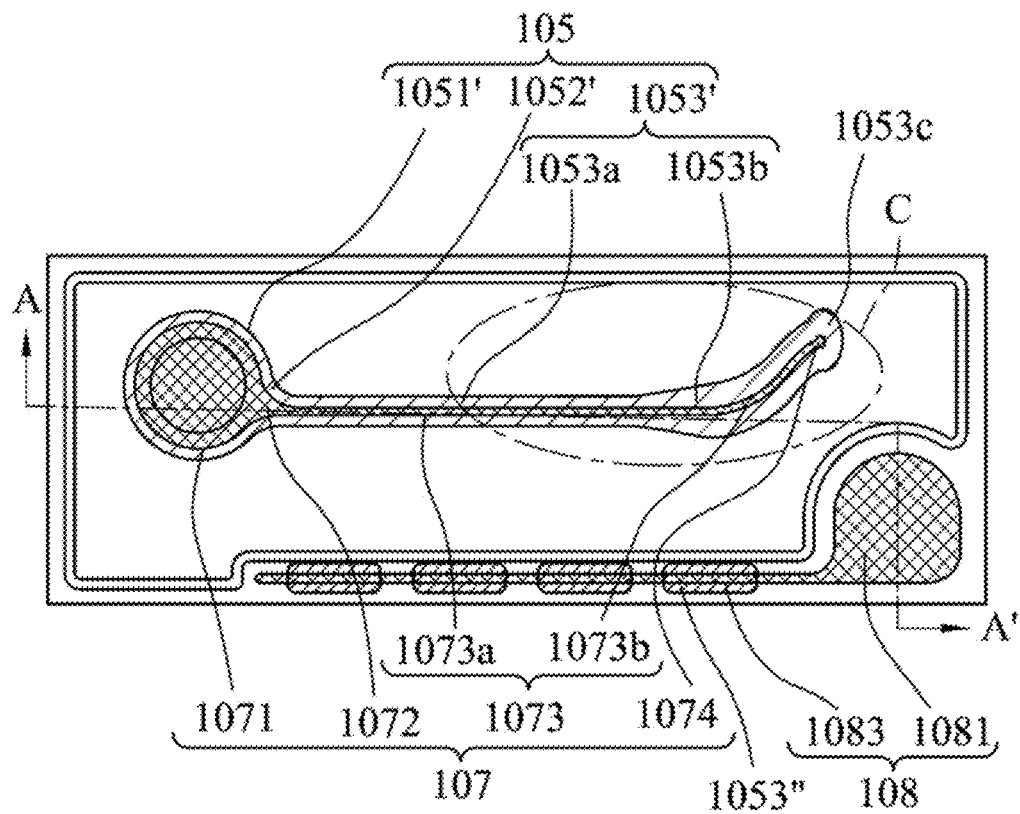
FIG. 5 is a top view illustrating a first embodiment of a light-emitting device of the disclosure.
Figure 6:
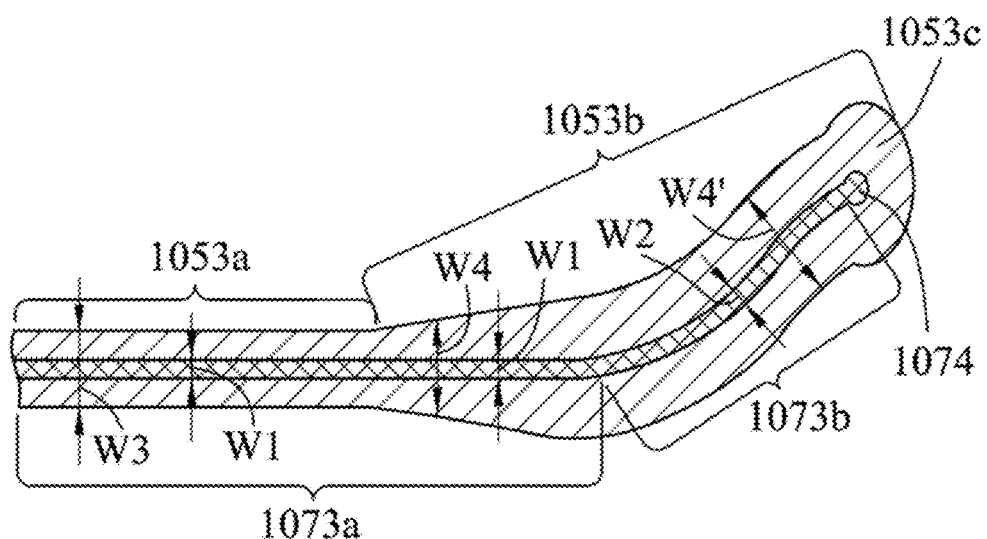
FIG. 6 is a partial enlarged view of area C in FIG. 5.
Figure 7:
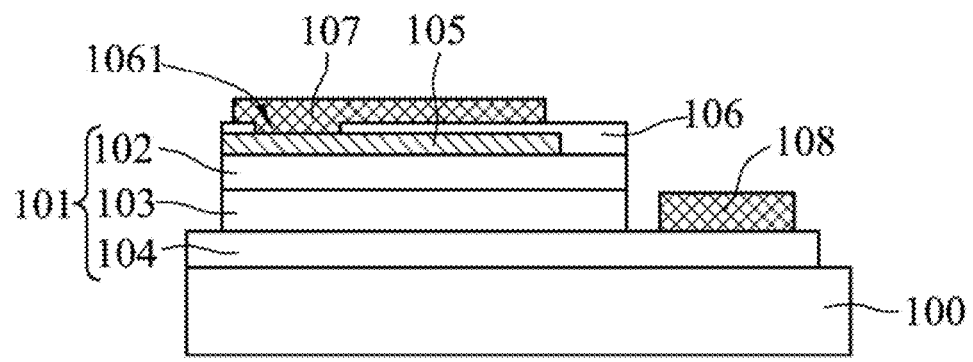
FIG. 7 is a sectional view taken along line A-A' of FIG. 5.

Referring to FIGS. 5 to 7, a light-emitting device in accordance with an embodiment of the disclosure is illustrated. The light-emitting device includes a substrate 100, a first type semiconductor layer 102, an active layer 103, a second type semiconductor layer 104, a current blocking layer 105 and a first electrode 107. In this embodiment, the light-emitting device further includes a transparent conductive layer 106 and a second electrode 108, as shown in FIG. 7. The first and second type semiconductor layers 102, 104 and the active layer 103 are assembled to be a light-emitting epitaxial structure 101.

The second type semiconductor layer 104 is disposed on the substrate 100. The active layer 103 and the first type semiconductor layer 102 are sequentially disposed on the second type semiconductor layer 104. In this embodiment, the second type semiconductor layer 104 has a portion exposed from the first type semiconductor layer 102 and the active layer 103.

The current blocking layer 105 is disposed on the first type semiconductor layer 102 to expose a portion of the first type semiconductor layer 102, and includes a first strip portion 1053'.

The first electrode 107 is disposed on the current blocking layer 105, and includes a first electrode pad 1071, a first electrode end portion 1074 distal from the first electrode pad 1071, and a first electrode extension portion 1073 extending between the first electrode pad 1071 and the first electrode end portion 1074.

In this embodiment, the transparent conductive layer 106 is disposed on the exposed portion of the first type semiconductor layer 102, and is partially disposed between the current blocking layer 105 and the first electrode 107.

In this embodiment, the second electrode 108 is disposed on the exposed portion of the second type semiconductor layer 104.

With the light-emitting device of this disclosure having the aforesaid structural configuration, the shape of the current blocking layer 105 is improved. Specifically, the first strip portion 1053' of the current blocking layer 105 is located beneath the first electrode extension portion 1073, and has a widened section 1053b having a width that gradually increases in a direction away from the first, electrode pad 1071.

In this embodiment, the substrate 100 may be made from one of sapphire ($Al_2O_3$), gallium nitride (GaN), silicon carbide (SiC), aluminum nitride (AlN) for epitaxial growth of indium gallium nitride (InGaN) or aluminum gallium nitride (AlGaN), and gallium arsenide (GaAs) for epitaxial growth of aluminum gallium indium phosphide (AlGaInP). The substrate 100 may have a top surface formed with a patterned structure for formation of the light-emitting epitaxial structure 101 thereon, so that light emitting from the light-emitting epitaxial structure 101 may be refracted by the patterned structure, thereby increasing brightness of the light-emitting device. Besides, the patterned structure also reduces dislocations formed in the light-emitting epitaxial structure 101, which is caused by lattice mismatch between the light-emitting epitaxial structure 101 and the substrate 100, thus improving epitaxial quality of the light-emitting epitaxial structure 101.

In this embodiment, the light-emitting epitaxial structure 101 may be formed using metal-organic chemical vapor deposition (MOCVD), molecular beam epitaxy (MBE), hydride vapor phase epitaxy (HVPE), or physical vapor deposition (PVD) including sputter and evaporative PVD. The first and second type semiconductor layers 102, 104, which are often referred to as cladding layers or confining layers, have opposite conducive types, polarity and conductivity, and are respectively doped with dopants used for providing holes and dopants used for providing electrons. For example, the first type semiconductor layer 102 may be a p-type semiconductor layer, and the second type semiconductor layer 104 may be an n-type semiconductor layer. When the light-emitting device is driven by current, electron-hole recombination occurs in the active layer 103, and energy of electron-hole recombination emerges as photons of light. The wavelength of the light emitting from the active layer 103 may be adjustable by tuning physical characteristics or chemical composition of at least one layer in the light-emitting epitaxial structure 101. The active layer 103 may be configured as a single heterostructure (SH), a double heterostructure (DH), or a multi-quantum-well (MQW) structure. The active layer 103 may be made of i-type (intrinsic) semiconductor, p-type semiconductor or n-type semiconductor.

In this embodiment, the light-emitting epitaxial structure 101 may be made from group III-V compound semiconductors, such as aluminum gallium indium phosphide-based (AlGaInP-based) compound semiconductor, which is represented by a chemical formula of $Al_xIn_yGa_{(1-x-y)}P$, or aluminum iridium gallium nitride-based (AlInGaN-based) compound semiconductor, which is represented by a chemical formula of $Al_xIn_yGa_{(1-x-y)}N$, where $0≤x$, $y≤1$, and $(x+y)≤1$. In the case that the light-emitting epitaxial structure 101 is made of $Al_xIn_yGa_{(1-x-y)}P$, the light emitting therefrom may be a red light having a wavelength ranging from 610 nm to 650 nm, or a yellow light having a wavelength ranging from 550 nm to 570 nm. In the case that the light-emitting epitaxial structure 101 is made of $Al_xIn_yGa_{(1-x-y)}N$, where x=0, the light emitting therefrom may be a blue light or a deep blue light having a wavelength ranging from 400 nm to 490 nm, or a green light having a wavelength ranging from 490 nm to 550 nm. In the case that the light-emitting epitaxial structure 101 is made of $Al_xIn_yGa_{(1-x-y)}N$, where y=0, the light emitting therefrom may be an ultraviolet (UV) light having a wavelength ranging from 220 nm to 400 nm.

In some embodiments, the light-emitting device further includes a buffer layer (not shown in figures) disposed between the light-emitting epitaxial structure 101 and the substrate 100, which is also beneficial to reduce dislocations caused by lattice mismatch, thereby improving epitaxial growth of the light-emitting epitaxial structure 101. The buffer layer may be made from GaN, AlGaN or AlN.

In this embodiment, the exposed portion of the second type semiconductor layer 104 is formed by vertically etching away portions of the first, type semiconductor layer 102 and the active layer 103, and is provided for disposing the second electrode 108 thereon, and meanwhile, a sidewall of the light-emitting epitaxial structure 101 is also exposed.

The current blocking layer 105 may be made of a transparent insulating material selected from inorganic materials including silicon oxide, silicon nitride, silicon oxynitride, titanium oxide, aluminum oxide, or combinations thereof, and may be formed as a single-layer structure or a multi-layered structure, which has at least two sub-layers alternately stacked with one another. The current blocking layer 105, when formed as a single-layer structure, may be made of a transparent material with high light transmittance, such as silicon oxide having a light transmittance up to 80%. The current blocking layer 105, when formed as a multi-layered structure, may be made of a reflective material. For example, the current blocking layer 105 may be formed as a distributed Bragg reflector (DBR) having a reflectivity higher than 601. The current blocking layer 105 has a thickness ranging from 50 μm to 500 μm.

Referring to FIG. 5, the second electrode 108 includes a second electrode pad 1081 and a second electrode extension portion 1083 extended from the second electrode pad 1081. The first and second electrode pads 1071, 1081 are used for input and output of external current, respectively, while the first and second electrode extension portions 1073, 1083 are used for lateral current spreading.

Each of the first and second electrodes 107, 108 may be formed as a single-layer structure or a multi-layered structure, and may be made of a metallic material selected from gold (Au), silver (Ag), copper (Cu), chromium (Cr), aluminum (Al), platinum (Pt), nickel (Ni), titanium (Ti), tin (Sn), rhodium (Rh), and alloys thereof. In some embodiments, the first and second electrodes 107, 108 are made of the same metallic material, and have the same thickness.

Generally, most of light-emitting diode (LED) chips are shaped into a rectangle, and a few of the same are shaped into a square. In this embodiment, the light-emitting device of the disclosure is shaped into a rectangle with two parallel long sides and two parallel short sides, as shown in FIG. 5. The first and second electrode pads 1071, 1081 are located in position close to the two short sides, respectively, in order to maximize the distance therebetween. The first electrode extension portion 1073 extends to the second electrode pad 1081, and the second electrode extension portion 1083 extends to the first electrode pad 1071.

Each of the first and second electrode pads 1071, 1081 may be independently shaped into a circle, an ellipse, a polygon or an irregular shape. The first and second electrode pads 1071, 1081 have widths much greater than those of the first and second electrode extension portions 1073, 1083, respectively.

Each of the first and second electrode extension portions 1073, 1083 independently has a width ranging from 1 μm to 10 μm. In this embodiment, the first electrode extension portion 1073 has a fixed width. In some embodiments, the first electrode extension portion 1073 has a width that gradually decreases and then remains fixed in the direction a way from the first electrode pad 2071. In some embodiments, the first electrode extension portion 1073 has a width that gradually decreases in the direction away from the first electrode pad 1071.

The first electrode end portion 1074 has a larger width relative to the first electrode extension portion 1073, so as to have a shape of a semicircle, a semi-ellipse or a polygon. The larger width of the first electrode end portion 1074 is beneficial to avoid charge concentration thereon, to facilitate current spreading, and to enhance ESD resistance performance accordingly.

In this embodiment, the first electrode 107 further includes a first electrode connection portion 1072 that extends between the first electrode pad 1071 and the first electrode extension portion 1073, and that plays a role of a width transition portion from the first electrode pad 1071 to the first electrode extension portion 1073. The first electrode connection portion 1072 has a width that gradually decreases in the direction away from the first electrode pad 1071 to prevent burnout caused by charge concentration due to large difference in width between the first electrode pad 1071 and the first, electrode extension portion 1073.

Referring to FIG. 5, in this embodiment, the first electrode extension portion 1073 includes a straight section 1073a extending from the first electrode pad 1071, and a curved section 1073b extending from the straight section 1073a in a direction away from the first electrode pad 1071 and connected to the first electrode end portion 1074. In this embodiment, the first electrode connection portion 1072 extends between the first electrode pad 1071 and the straight section 1073a of the first electrode extension portion 1073.

To be specific, the straight section 1073a constantly extends in an extension direction toward the second electrode pad 1081. The curved section 1073b has an extension direction deviated from that of the straight section 1073a, and is formed as a curve having a radius of curvature that may be fixed or variable. In this embodiment, the first and second electrode pads 1071, 1081 are respectively located in position corresponding to two diagonal corners of the light-emitting device in a top view thereof. The curved section 1073b extends in the extension direction toward the other corner of the short side where the second electrode pad 1081 is located, and is positioned at a predetermined distance or a distance larger than the predetermined distance away from the second electrode pad 1081. The predetermined distance ranges from one-half to two-thirds of a distance between the straight section 1073a and the most adjacent boundary of the light-emitting device. Thus, it is able to avoid current, crowding due to a too short distance between the straight section 1073a and the second electrode pad 1081 caused by absence of the curved section 3073b. Therefore, current spreading around the second electrode pad 1081 is facilitated.

Referring to FIG. 6, the straight section 1073a and the curved section 1073b have a width W1 and a width W2, respectively. The widths W1, W2 range from 1 μm to 10 μm. In this embodiment, the widths W1, W2 are fixed. In some embodiments, the width W1 gradually decreases and then remains fixed in the direction away from the first electrode pad 1071, and the width W2 is fixed. In some embodiments, the width W1 gradually decreases in the direction away from the first electrode pad 1071, and the width W2 continues to gradually decreases toward the first, electrode end portion 1074. Gradual decrease in width of at least one of the straight section 1073a and the curved section 1073b facilitates lateral spreading of current toward both sides of the first electrode extension portion 1073.

Referring to FIG. 5, in this embodiment, the current blocking layer 105 includes a first pad portion 1051' located beneath the first electrode pad 1071, the first strip portion 1053' that extends from the first pad portion 1051' and that is located beneath the first electrode extension portion 1073, and a first transition portion 1052' that extends between the first pad portion 1051' and the first strip portion 1053' and that is located beneath the first electrode connection portion 1072. The first pad portion 1051' and the first strip portion 1053' have widths larger than those of the first electrode pad 1071 and the first electrode extension portion 1073, respectively. In this embodiment, the first strip portion 1053' of the current blocking layer 105 is a continuous film.

Accordingly, a current injected from the first electrode pad 1071 is blocked from flowing downwardly by the first pad portion 1051' of the current blocking layer 105, and hence, the current spreads out by flowing through the first electrode extension portion 1073 and the transparent conductive layer 106. Afterwards, the current at the transparent conductive layer 106 in position corresponding to the first electrode extension portion 1073 is blocked again from flowing downwardly by the first strip portion 1053' of the current, blocking layer 105, so that the current further laterally spreads out and can be uniformly injected into the first type semiconductor layer 102.

The current blocking layer 105 further includes a second pad portion located beneath the second electrode pad 1081, and a second strip portion 1053" that extends from the second pad portion and that is located beneath the second electrode extension portion 1083. In this embodiment, the second strip portion 1053" may be formed as a plurality of independent blocks, as shown in FIG. 5. The independent blocks stop current spread at the second electrode extension portion 1083 by blocking current from flowing downward in position corresponding to the independent blocks, and hence, the current flows downward toward the second type semiconductor layer 104 via the second electrode extension portion 1083 in corresponding position between the two adjacent independent blocks. That is because a contact region between the second electrode extension portion 1083 and the second type semiconductor layer 104 in corresponding position between the two adjacent, independent blocks has a lower contact resistance.

Referring to FIG. 5, the first strip portion 1053' of the current blocking layer 105 further includes a pad-proximal section 1053a that is connected to the widened section 1053b and that is more proximal to the first electrode pad 1071 than the widened section 1053b. The widened section 1053b further has an end enlarged part 1053c extending to a position beneath the first electrode end portion 1074.

Referring to FIG. 6, the pad-proximal section 1053a is located beneath the straight section 1073a of the first electrode extension portion 1073. The widened section 1053b is located beneath the curved section 1073b of the first electrode extension portion 1073. In this embodiment, the widened section 1053b is further located beneath a portion of the straight section 1073a of the first electrode extension portion 1073, The excessive length of the widened section 1053b may result in excessive light absorption, hence, in some embodiments, the widened section 1053b is further located beneath a position only ranging from one half to one fourth of the straight section 1073a of the first electrode extension portion 1073. For example, the widened section 1053b is further located beneath one third of the straight section 1073a of the first electrode extension portion 1073.

The pad-proximal section 1053a has a width W3 that is larger than a width of a part of the first electrode extension portion 1073 positioned thereabove (i.e., the width W1 of the straight section 1073a) by a first width difference D1. The widened section 1053b has a width W4 that is larger than a width of a part of the first electrode extension portion 1073 positioned thereabove (i.e., the width W1 of the straight section 1073a or the width W2 of the curved section 1073b) by a second width difference D2.

The first width difference D1 is larger than 0 μm, and is constant for the entire pad-proximal section 1053a regardless of the width W1 of the straight section 3073a being fixed or variable. The first width difference D1 is not less than 5 μm and may be up to 20 μm, because the excessive value of the first width difference D1 would make the light-emitting device requiring a higher driven voltage, and thus, the width W3 ranges from 5 μm to 21 μm.

The second width difference D2 is larger than 0 μm, and is variable rather than fixed. In this embodiment, the second width difference D2 gradually increases and then remains fixed in the direction away from the first electrode pad 1071. In some embodiments, the width W4 of the widened section 1053b gradually increases and reaches a maximum width W4' at position corresponding to a junction between the straight section 1073a and the curved section 1073b and then remains fixed with the maximum width W4' in the direction away from the first electrode pad 1071 at position corresponding to the curved section 1073b, as shown in FIG. 6. The maximum width W4' is larger than the width W3, and ranges from 10 μm to 40 μm. The second width difference D2 may range from 5 μm to 30 μm at a position corresponding to the widened section 1053b with the maximum width W4'.

In some embodiments, the second width difference D2 gradually increases in the direction away from the first electrode pad 1071. In some embodiments, the second width difference D2 increases in the direction away from the first electrode pad 1071 in a linear manner.

In this embodiment, the second width difference D2 is larger than the first width difference D1. In some embodiments, the second width difference D2 is at least 1 μm larger than the first width difference D1. In some embodiments, the second width difference D2 is larger than the first width difference D1 by 5 μm to 25 μm. In some embodiments, the second width difference D2 is larger than the first width difference D1 by 4 μm to 8 μm.

In an example of this embodiment, each of the widths W1 and W2 is a fixed value of 2.5 μm, the width W3 is 8.5 μm, and the maximum width W4' is 14.5 μm.

Referring to FIG. 5, a width difference between the first transition portion 1052' of the current blocking layer 105 and the first electrode connection portion 1072 is equal to the first width difference D1. A width difference between the end-enlarged part. 1053c and the first electrode end portion 1074 is larger than the first width difference D1.

In this embodiment, the transparent conductive layer 106 may be made of a transparent conductive material, such as a conductive oxide-based material or a transparent metallic material. An ohmic contact can be formed between the transparent conductive layer 106 and the first type semiconductor layer 102. For example, the transparent conductive layer 106 may be made of a metallic oxide selected from one of indium tin oxide (ITO), zinc oxide (ZnO), zinc indium tin oxide (ZITO), zinc indium oxide (ZIO), zinc tin oxide (ZTO), gallium indium tin oxide (GITO), gallium indium oxide (GIO), gallium-doped zinc oxide (GZO), aluminum-doped zinc oxide (AZO), and fluorine-doped tin oxide (FTO). The transparent conductive layer 106 has a light transmittance to light emitted from the active layer 103 of up to 60%, 70%, 75%, 80%, or even higher. The coverage of the transparent conductive layer 106 on the first type semiconductor layer 102 is at least 80% or larger, i.e., at least 90%.

In this embodiment, the transparent conductive layer 106 further includes an opening 1061 that is located beneath the first electrode pad 1071 and that has a dimension leas than the dimension of the first electrode pad 1071. In this embodiment, the transparent conductive layer 106 is disposed on the exposed portion of the first type semiconductor layer 102, and is partially disposed between the current blocking layer 105 and the first electrode 107 except on the opening 1061 to expose a portion of the first pad portion 1051' of the current blocking layer 105. Thereby, the first electrode 107 including the first electrode pad 1071, the first electrode connection portion 1072, the first electrode extension portion 1073 and the first electrode end portion 1074 are disposed on the transparent conductive layer 106, and the first electrode pad 1071 extends through the opening 1061 to be disposed on the exposed portion of the first pad portion 1051' of the current, blocking layer 105. In other words, the first electrode pad 1071 may not be in direct contact with the first type semiconductor layer 102 because the current injected from the first electrode pad 1071 may flow to the transparent conductive layer 106 through the first electrode extension portion 1073 to achieve more effective spreading.

The first pad portion 1051' of the current blocking layer 105 has a shape approximately the same as that of the first electrode pad 1071, and has a dimension larger than that of the first electrode pad 1071. In some embodiments, the first pad portion 1051' of the current blocking layer 105 may be formed as a plurality of independent pads that, are spaced apart from each other to expose a portion of the first type semiconductor layer 102, so that the first electrode pad 1071 can be connected to the exposed portion of the first type semiconductor layer 102. In some embodiments, the first pad portion 1051' of the current blocking layer 105 may be formed as a ring and a pad disposed at the center of the ring and spaced apart therefrom. That is, the first pad portion 1051' of the current blocking layer 105 may be formed with a ring-like opening, so that the first electrode pad 1071 can be connected to the first type semiconductor layer 102 via the ring-like opening.

Figure 8:
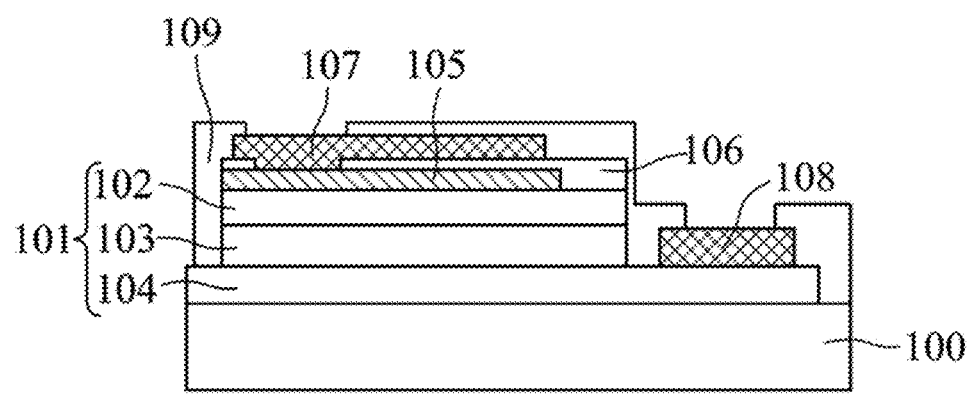
FIG. 8 is a sectional view illustrating a first embodiment of the light-emitting device with a transparent protection layer disposed thereon.

Referring to FIG. 8, in order to achieve isolation from moisture, the light-emitting device further includes a transparent protection layer 109 disposed on the transparent conductive layer 106, the sidewall of the light-emitting epitaxial structure 101, and the first and second electrodes 107, 108 to expose portions of the first and second electrodes 107, 108 for external connection. The transparent protection layer 109 may be made of an inorganic insulating materials selected from one of silicon oxide, silicon nitride, silicon oxynitride, titanium oxide, aluminum oxide, or combinations thereof. The transparent protection layer 109 may be made of a material with high light transmittance, such as silicon oxide, which has a light transmittance up to 80%. The transparent protection layer 109 may be formed as a multi-layered structure to achieve a reflectivity higher than 60%, such as a distributed Bragg reflector (DBR). The transparent protection layer 109 has a thickness ranging from 50 μm to 500 μm.

Figure 9:
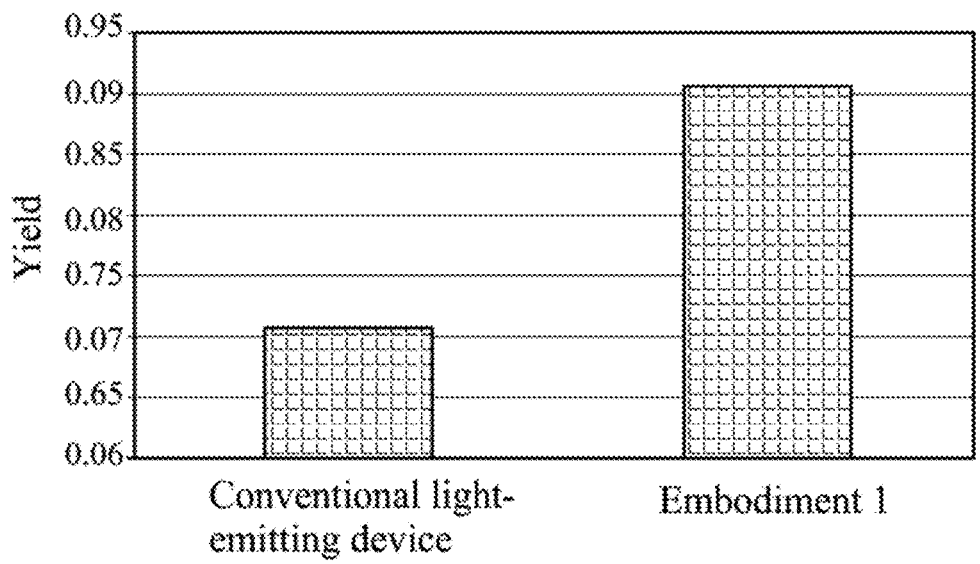
FIG. 9 is a bar plot showing yield of Comparative Examples of the conventional light-emitting device and yield of Examples of the light-emitting device of the disclosure.

In order to verify the ESD resistance of the light-emitting device of the disclosure, yield obtained from the Examples of the first embodiment of the light-emitting device and that of the Comparative Examples of the conventional light-emitting device of FIG. 1 are compared, and the results are shown in FIG. 9. All of the Examples of the first embodiment of the light-emitting device and the Comparative Examples of the conventional light-emitting device are configured to emit a blue light, and are tested under a forward bias of 200 V. It can be seen that the yield of the Examples of the first embodiment of the light-emitting device is significantly improved by adopting the widened section 1053b of the first strip portion 1053' of the current blocking layer 105 that is located beneath the first electrode extension portion 1073. In comparison with the conventional light-emitting device having a fixed width difference between a width of the strip portion of the current blocking layer 3 and that of the extension 42 of the first electrode 4, adjusting the shape of the first strip portion 1053' of the current blocking layer 105 optimizes distribution of electric field, and enhances the ESD resistance of the light-emitting device.

In some embodiments, the substrate 100 has a bottom surface opposite to the light-emitting epitaxial structure 101 that is covered by a reflective layer, such as a metallic reflective layer or a DBR, so as to facilitate light extraction from the sidewall of the light-emitting epitaxial structure 101 or a top surface of the light-emitting epitaxial structure 101 opposite to the substrate 100.

In some embodiments, the light-emitting device may be further in cooperation with a package frame, such as a bowl-like resin-based substrate or a plane ceramic substrate, and an encapsulant to be sealed on a light-emitting side of the light-emitting device, such as a transparent resin, so as to form a package structure. In some embodiments, the encapsulant may be further mixed with phosphor granules to enable the package structure to emit, blue light, green light, red light, or white light.

The package structure may be further made into a variety of light-emitting apparatuses, for example, white light lighting, backlight displays, RGB displays, automotive lighting, flash lamps, projection lamps, stage lighting, ultraviolet germicidal lamps, filament lamps, etc.

Embodiment 2

Figure 10:
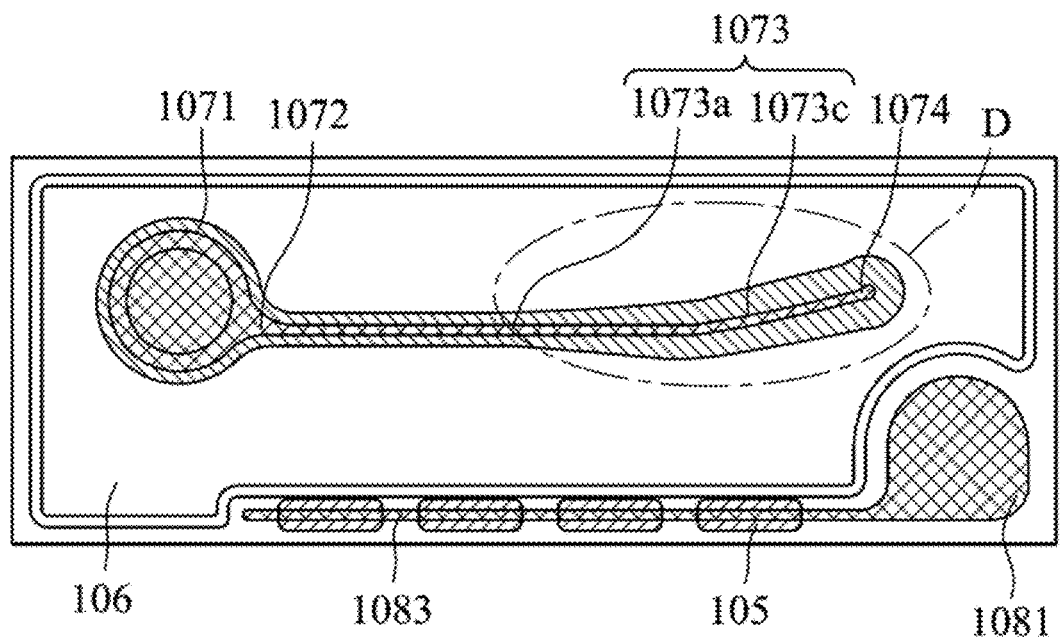
FIG. 10 is a top view illustrating a second embodiment of the light-emitting device of the disclosure.
Figure 11:
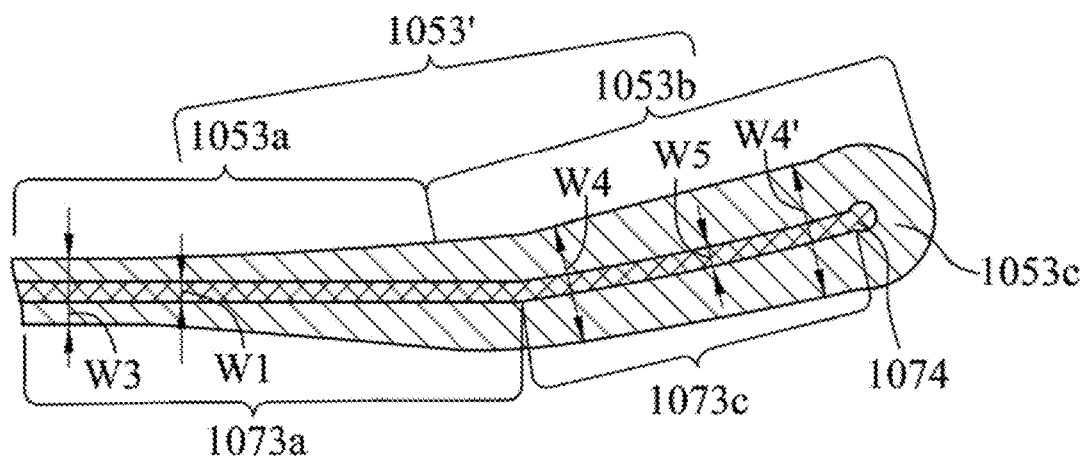
FIG. 11 is a partial enlarged view of area D in FIG. 10.

Referring to FIGS. 10 to 11, a second embodiment of the light-emitting device has a structure similar to that of the first, embodiment except that the curved section 1073b of the first electrode extension portion 1073 is replaced by a fold-line section 1073c. The widened section 1053b of the first strip portion 1053' of the current blocking layer 105 is located beneath the fold-line section 1073c of the first electrode extension portion 1073.

In this embodiment, the first electrode extension portion 1073 includes the straight section 1073a extending from the first electrode pad 1071, and the fold-line section 1073c that extends from the straight section 1073a in a direction away from the first electrode pad 1071 and that is connected to the first electrode end portion 1074.

The straight section 1073a likewise extends in a direction toward the second electrode pad 1081, and the fold-line section 1073c has an extension direction deviated from that of the straight section 1073a. The fold-line section 1073c may be regarded as an another straight section having an extension direction different from that, of the straight section 1073a. The fold-line section 1073c is positioned at the predetermined distance as mentioned in Embodiment 1 above or a distance larger than the predetermined distance away from the second electrode pad 1081 to avoid current crowding effect and to facilitate current spreading around the second electrode pad 1081.

In this embodiment, as shown in FIG. 11, the widened section 1053b of the first strip portion 1053' of the current blocking layer 105 is also located beneath the straight section 1073a of the first electrode extension portion 1073.

Referring to FIG. 11, the straight, section 1073a and the fold-line section 1073c have the width W1 and a width W5, respectively. The characteristics of the width W5 is the same as that of the width W2. In this embodiment, the widths W1, W5 are fixed. In some embodiments, the width W1 gradually decreases and then remains fixed in the direction away from the first electrode pad 1071, and the width W5 is fixed. In some embodiments, the width W1 gradually decreases in the direction away from the first electrode pad 1071, and the width W5 continues to gradually decreases toward the first electrode end portion 1074.

The widened section 1053*b* has the width W4 larger than a width of the part, of the first electrode extension portion 1073 positioned thereabove (i.e., the width W1 of the straight section 1073*a* or the width W5 of the fold-line section 1073*c*) by a third width difference D3. The characteristics of the third width difference D3 is the same as that of the second width difference D2.

Details regarding the relationships between dimensions of the pad-proximal section 1053*a*, the widened section 1053*b*, and the part of the first electrode extension portion 1073 positioned thereabove (i.e., the first width difference D1 and the third width difference D3) are similar to those described above with reference to FIG. 6.

Embodiment 3

Figure 12:
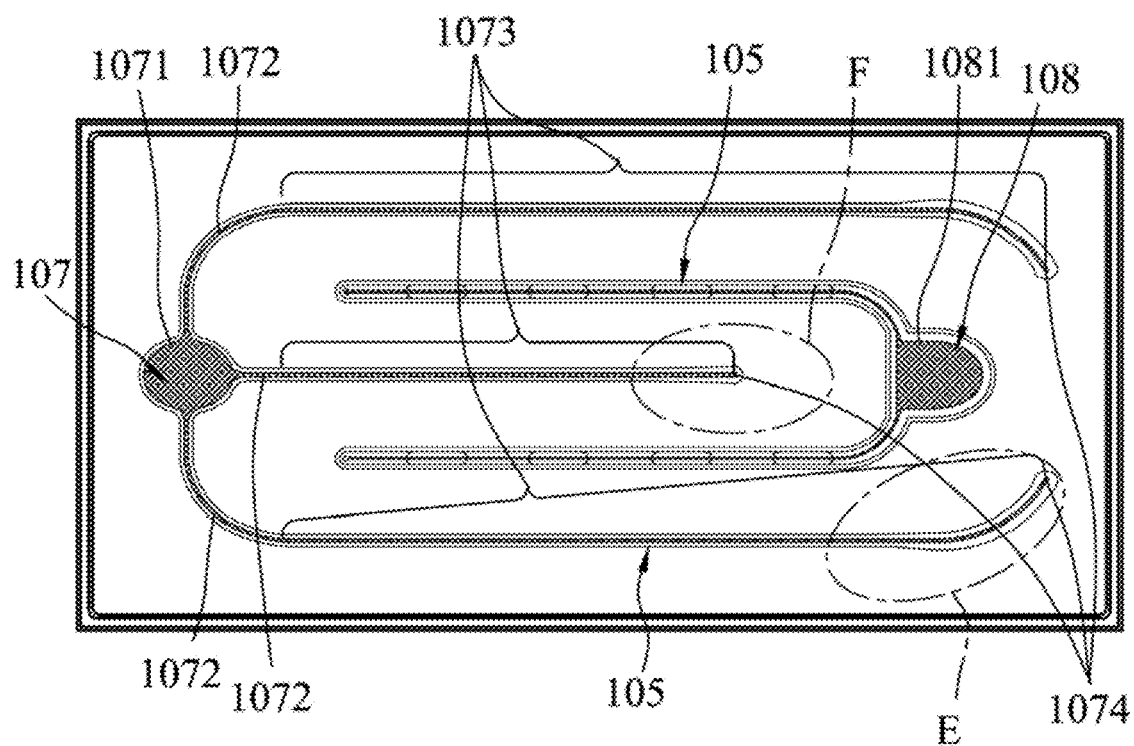
FIG. 12 is a top view illustrating & third embodiment of the light-emitting device of the disclosure.
Figure 13:
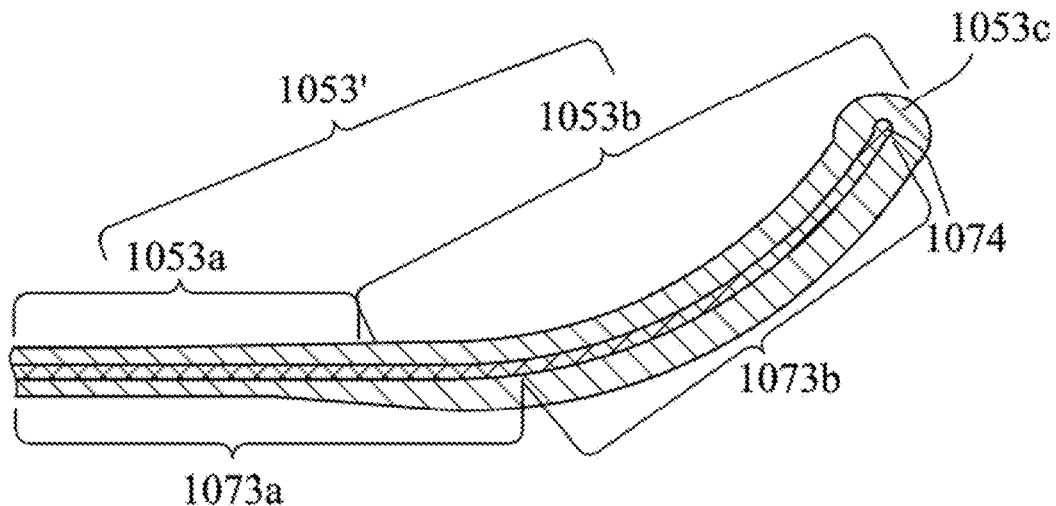
FIG. 13 is a partial enlarged view of area E in FIG. 12.
Figure 14:
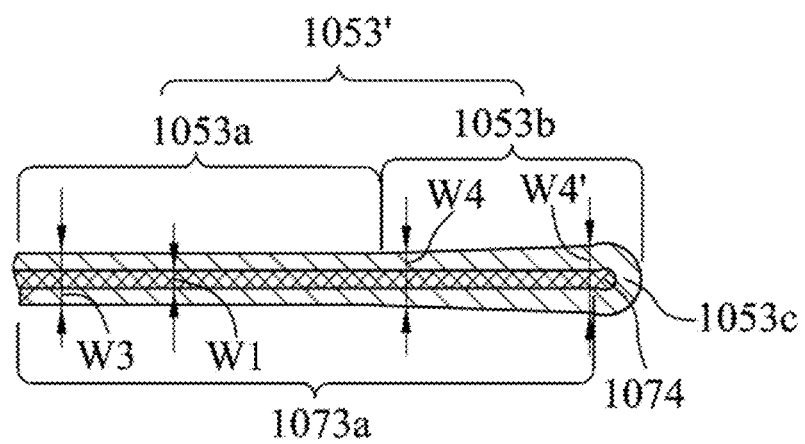
FIG. 14 is a partial, enlarged view of area F in FIG. 12.

Referring to FIGS. 12 to 14, a third embodiment of the light-emitting device has a structure similar to that of the first embodiment of the light-emitting device. However, the first electrode 107 includes at least two of the first electrode extension portions 1073 extending in the direction toward the second electrode pad 1081, and the current blocking layer 105 includes at least two of the first strip portions 1053' located beneath a corresponding one of the first electrode extension portions 1073. Each of the first strip portions 1053' has a corresponding one of the widened sections 1053*b*.

Referring to FIG. 12, three of the first electrode extension portions 1073 of the first electrode 107 are exemplified to illustrate the structural relationship therebetween.

In this example, the first electrode 107 includes the first electrode pad 1071, three of the first electrode end portions 1074 distal from the first electrode pad 1071, and three of the first electrode extension portions 1073 that independently extend between the first electrode pad 1071 and a corresponding one of the first electrode end portions 1074. Furthermore, the first electrode 107 includes three of the first electrode connection portions 1072, each of which extends between the first electrode pad 1071 and a corresponding one of the first electrode extension portions 1073.

The current blocking layer 105 includes the first pad portion 1051' located beneath the first electrode pad 1071, three of the first strip portions 1053' that independently extend from the first pad portion 1051', and three of the first transition portions 1052' that independently extend between the first pad portion 1051' and a corresponding one of the first strip portions 1053'. Each of the first strip portions 1053' is located beneath a corresponding one of the first electrode extension portions 1073, and each of the first transition portions 1052' is located beneath a corresponding one of the first electrode connection portions 1072.

Each of the first strip portions 1053' further includes a corresponding one of the pad-proximal sections 1053*a*. Each of the pad-proximal sections 1053*a* is connected to a corresponding one of the widened sections 1053*b*, and is more proximal to the first electrode pad 1071 than a corresponding one of the widened sections 1053*b*. Each of the widened sections 1053*b* further has a corresponding one of the end enlarged parts 1053*c* extending to a position beneath a corresponding one of the first electrode end portions 1074.

Referring to FIG. 12, two of the first electrode extension portions 3073 are located in position close to the two long sides of the light-emitting device, respectively, and the remaining one of the first electrode extension portions 1073 is located therebetween in position equidistant from the two long sides.

Each of the first electrode extension portions 1073 that is located in position close to the two long sides of the light-emitting device includes a corresponding one of the straight sections 1073*a* that extends from the first electrode pad 1071, and a corresponding one of the curved sections 1073*b* that extends from the corresponding one of the straight sections 1073*a*. Each of the curved sections 1073*b* is connected to a corresponding one of the first electrode end portions 1074, as shown in FIGS. 12 and 13.

Each of two of the pad-proximal sections 1053*a* of the first strip portions 1053' of the current blocking layer 105 is located beneath a corresponding one of the straight sections 1073*a* of the first electrode extension portions 1073. Each of two of the widened sections 1053*b* of the first strip portions 1053' of the current blocking layer 105 is located beneath a corresponding one of the curved sections 1073*b* of the first electrode extension portions 1073, and is further located beneath a portion of a corresponding one of the straight, sections 1073*a*.

The first electrode extension portion 1073, which is located in position equidistant from the two long sides, has a structure similar to that of the first electrode extension portion 1073 of the first embodiment except that the curved section 1073*b* is omitted. The first electrode extension portion 1073, which is located in position equidistant from the two long sides, includes the straight section 1073*a* that extends from the first electrode pad 1071 in a direction toward the second electrode pad 1083 and that is connected to a corresponding one of the first electrode end portions 1074, as shown in FIGS. 12 and 14. The straight section 1073*a* is positioned at a distance ranging from one tenth to a quarter of a length of the first electrode extension portions 1073 away from the second electrode pad 1081.

One of the pad-proximal sections 1053*a* of the first strip portions 1053' of the current blocking layer 105 and one of the widened sections 1053*b* of the first strip portions 1053' of the current blocking layer 105 are located beneath the straight section 1073*a*.

In some embodiments, the straight sections 1073*a* may be replaced by the curved sections 1073*b*, and the widened sections 1053*b* of the first strip portions 1053' of the current blocking layer 105 are respectively located beneath the curved sections 1073*b*.

Details regarding the relationships between dimensions of the pad-proximal section 1053*a*, the widened section 1053*b*, and the part of the first electrode extension portion 1073 positioned thereabove (i.e., the first width difference D1 and the second width difference D2) are similar to those described above with reference to FIG. 6.

Figure 15:
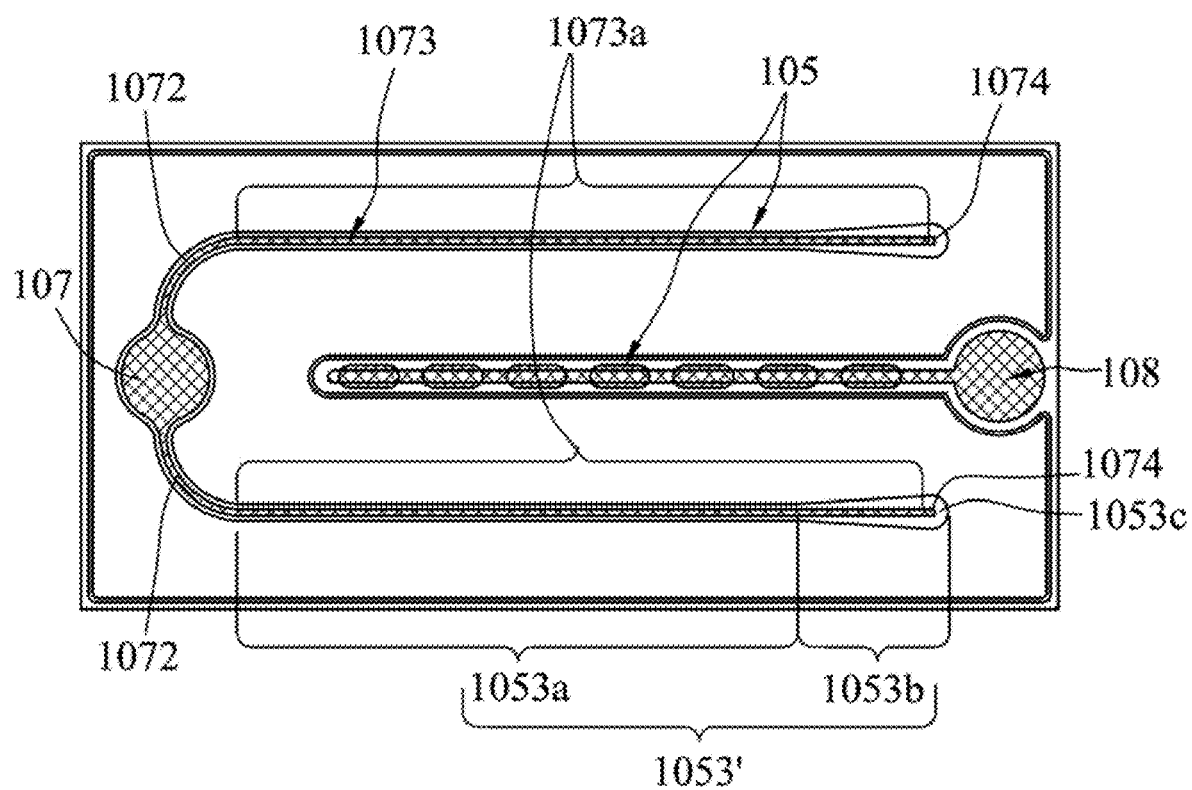
FIG. 15 is a Lop view illustrating a fourth embodiment of the light-emitting device of the disclosure.

Referring to FIG. 15, two of the first electrode extension portions 1073 of the first electrode 107 are exemplified to illustrate the structural relationship therebetween.

In this example, the first electrode 107 includes the first electrode pad 1071, two of the first electrode end portions 1074 distal from the first electrode pad 1071, and two of the first electrode extension portions 1073 that independently extendbetween the first electrode pad 1071 and a corresponding one of the first electrode end portions 1074. The first electrode 107 further includes two of the first electrode connection portions 1072 that extend between the first electrode pad 1071 and a corresponding one of the first electrode extension portions 1073.

Two of the first electrode extension portions 1073 are located in position close to the two long sides of the light-emitting device, respectively. Each of the first electrode extension portions 1073 includes a corresponding one of the straight sections 1073*a* that extends from the first electrode pad 1071 in a direction toward the second electrode pad 1081 and that is connected to a corresponding one of the first, electrode end portions 1074.

The current blocking layer 105 includes the first pad portion 1051' located beneath the first electrode pad 1071, two of the first strip portions 1053' that independently extend from the first pad portion 1051', and two of the first transition portions 1052' that independently extend between the first pad portion 1051' and a corresponding one of the first strip portions 1053'. Each of the first strip portions 1053' is located beneath a corresponding one of the first electrode extension portions 1073, and each of the first transition portions 1052' is located beneath a corresponding one of the first electrode connection portions 1072.

Each of the first strip portions 1053' further includes a corresponding one of the pad-proximal sections 1053*a*. Each of the pad-proximal sections 1053*a* is connected to a corresponding one of the widened sections 1053*b*, and is more proximal to the first electrode pad 1071 than a corresponding one of the widened sections 1053*b*. Each of the widened sections 1053*b* further has a corresponding one of the end enlarged parts 1053*c* that extends to a position beneath a corresponding one of the first electrode end portions 1074.

Each of the pad-proximal sections 1053*a* is located beneath a corresponding one of the straight sections 1073*a*. Each of the widened sections 1053*b* is located beneath a portion of a corresponding one of the straight section 1073*a*.

Each of the widened sections 1053*b* has a length no larger than one fifth of a length of the light-emitting device. In this example, each of the widened sections 1053*b* has a length of about 100 μm. Each of the widened section 1053*b* linearly increases in the direction away from the first electrode pad 1071. The maximum width W4' of each of the widened sections 1053*b* is larger than the width W3 of a corresponding one of the pad-proximal sections 1053*a* by 12 μm.

To sum up, by having the abovementioned structures, the light-emitting device of this disclosure is able to achieve improvement in the shape of the current blocking layer 105, such that the first strip portion 1053' located beneath the first electrode extension portion 1073 has the widened section 1053*b* that has a width which gradually increases in a direction away from the first electrode pad 1071. Therefore, at the first electrode extension portion 1073 near the first electrode end portion 1074, a phenomenon of excessive accumulation of charge under electrostatic shock, and a phenomenon of current crowding due to alignment offset, between the first electrode extension portion 1073 and the first strip portion 1053' of the current blocking layer 105 are avoidable, thereby enhancing the electrostatic discharge (ESD) resistance and reliability of the light-emitting device of this disclosure.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A light-emitting device, comprising:
a first type semiconductor layer;
a second type semiconductor layer;
an active layer disposed between said first type semiconductor layer and said second type semiconductor layer;
a current blocking layer that is disposed on said first type semiconductor layer to expose a portion of said first type semiconductor layer, said current blocking layer including a first strip portion; and
a first electrode that is disposed on said current blocking layer and that includes a first electrode pad, a first electrode end portion distal from said first electrode pad, and a first electrode extension portion extending between said first electrode pad and said first electrode end portion,
wherein said first strip portion of said current blocking layer is located beneath said first electrode extension portion and has a widened section having a width that gradually increases in a direction away from said first electrode pad,
wherein said first strip portion of said current blocking layer further includes a pad-proximal section that is connected to said widened section and that is more proximal to said first electrode pad than said widened section, said pad-proximal section having a width W3 larger than a width W1 of a part of said first electrode extension portion positioned there above, said widened section having a width W4 lamer than a width W2 of a part of said first electrode extension portion positioned there above, a first width difference between the width W3 and the width W1 being less than a second width difference between the width W4 and the width W2, and
wherein said second type semiconductor layer has a portion exposed from said first type semiconductor layer and said active layer, said light-emitting device further including a transparent conductive layer that is disposed on said exposed portion of said first type semiconductor layer and that is partially disposed between said current blocking layer and said first electrode; and a second electrode disposed on said exposed portion of said second type semiconductor layer.

2. The light-emitting device of claim 1, wherein the first width difference is constant.

3. The light-emitting device of claim 1, wherein the first width difference is not less than 5 μm and is up to 20 μm.

4. The light-emitting device of claim 1, wherein the second width difference is at least 1 μm larger than the first width difference.

5. The light-emitting device of claim 1, wherein the second width difference gradually increases in the direction away from said first electrode pad.

6. The light-emitting device of claim 1, wherein the second width difference gradually increases and then remains fixed in the direction away from said first electrode pad.

7. The light-emitting device of claim 1, wherein said first electrode extension portion includes a straight section that is connected to said first electrode pad and said first electrode end portion, said widened section of said first strip portion of said current blocking layer being located beneath said straight section.

8. The light-emitting device of claim 1, wherein said first electrode extension portion includes a straight section extending from said first electrode pad, and a curved section that extends from said straight section and that is connected to said first electrode end portion, said widened section of said first strip portion of said current blocking layer being located beneath said curved section.

9. The light-emitting device of claim 8, wherein at least one of said straight section and said curved section has a fixed width.

10. The light-emitting device of claim 8, wherein at least one of said straight section and said curved section has a width that gradually decreases in the direction away from said first electrode pad.

11. The light-emitting device of claim 8, wherein said widened section of said first strip portion of said current blocking layer is further located beneath a portion of said straight section of said first electrode extension portion.

12. The light-emitting device of claim 11, wherein said widened section of said first strip portion of said current blocking layer is further located beneath a position ranging from one half to one fourth of said straight section of said first electrode extension portion.

13. The light-emitting device of claim 11, wherein said widened section having a width that gradually increases in the direction away from said first electrode pad at position corresponding to said straight section of said first electrode extension portion and that remains fixed in the direction away from said first electrode pad at position corresponding to said curved section of said first electrode extension portion.

14. The light-emitting device of claim 1, wherein said first electrode extension portion includes a straight section that extends from said first electrode pad and a fold-line section that extends from said straight section and that is connected to said first electrode end portion, said widened section of said first strip portion of said current blocking layer being located beneath said fold-line section.

15. The light-emitting device of claim 14, wherein at least one of said straight section and said fold-line section has a fixed width.

16. The light-emitting device of claim 14, wherein said widened section of said first strip portion of said current blocking layer is located beneath a portion of said straight section of said first electrode extension portion.

\* \* \* \* \*